(12) United States Patent
Lo

(10) Patent No.: US 6,766,851 B1
(45) Date of Patent: Jul. 27, 2004

(54) HEAT SINK FIN ASSEMBLY

(75) Inventor: Ruei-An Lo, Taipei (TW)

(73) Assignee: Hsiang Kang Enterprise Co., Ltd., Taipei (TW)

(*) Notice: Subject to any disclaimer, the term of this patent is extended or adjusted under 35 U.S.C. 154(b) by 0 days.

(21) Appl. No.: 10/369,708

(22) Filed: Feb. 21, 2003

(30) Foreign Application Priority Data

Dec. 26, 2002 (TW) .................................... 91221228 U

(51) Int. Cl.[7] .............................................. H05K 7/20
(52) U.S. Cl. ...................... 165/185; 165/78; 165/80.3; 174/16.3; 257/722; 361/704
(58) Field of Search .............................. 165/80.3, 185, 165/78, 182; 174/16.3; 257/722; 361/704

(56) References Cited

U.S. PATENT DOCUMENTS

| | | | | |
|---|---|---|---|---|
| 2,434,676 A | * | 1/1948 | Spender | 165/80.3 |
| 6,104,609 A | * | 8/2000 | Chen | 165/80.3 |
| 6,336,498 B1 | * | 1/2002 | Wei | 165/80.3 |
| 6,449,160 B1 | * | 9/2002 | Tsai | 165/80.3 |
| 6,474,407 B1 | * | 11/2002 | Chang et al. | 165/80.3 |
| 6,607,023 B2 | * | 8/2003 | Ho et al. | 165/78 |
| 6,607,028 B1 | * | 8/2003 | Wang et al. | 165/185 |
| 6,672,379 B1 | * | 1/2004 | Wang et al. | 165/185 |
| 2004/0040700 A1 | * | 3/2004 | Tsai et al. | 165/185 |

FOREIGN PATENT DOCUMENTS

DE          3314870 C1  *  8/1984  ................. 361/704

* cited by examiner

Primary Examiner—Leonard R. Leo

(57) ABSTRACT

A heat sink fin assembly structure, suitable for various kinds of computer chip sets or processors, mainly has a plurality of heat sink fins assembled to form a plurality of upright and parallel heat sink fins on a base seat of the heat sink. The present invention is characterized that a lateral rim on a bottom portion of a piece-shaped main body of the heal sink fin extends to form a connection piece. A plurality of position holes are drilled on the connection piece and side rims thereof bend upwards from a plurality of position pieces and holding pieces. A second heat sink fin is assembled to the lateral sides of a first heat sink fin such that the heat sink fins fix and connect each other thereby eliminating the need of molding and extruding the heat sink so as to achieve the effect of cost saving.

3 Claims, 4 Drawing Sheets

HEAT SINK FIN ASSEMBLY

BACKGROUND OF THE INVENTION

1) Field of the Invention

The present invention relates to a heat sink fin assembly structure, more particularly to a heat sink suitable for various computer chip sets or processors. Each fin is interlocked and connected with another thereby reducing the cost.

2) Description of the Prior Art

It is well known that computer chip sets or processors generate high heat while operating. The faster the speed is, the higher the watts of driving electricity are; the higher the temperature will be. If the temperature of computer chip sets or processors is too high, the operation thereof will be affected causing crashes of computers.

A conventional heat sink assembly includes a plurality of upright and parallel heat sink fins located on the top of an aluminum base above the chip sets or processors extending upward. The heat from chip sets or processors is transmitted to a plurality of heat sink fins after being absorbed by the base and then performs heat exchange with cold air in the interspace between heat sink fins thereby achieving the purpose of heat dissipation. In addition, a fan is installed above the heat sink in some types of heat sinks, which speeds up the airflow in the interspace thereby accelerating heat dissipation and decreasing the temperature of chip sets or processors. The heat sinks with an alternate fan are also applied within the scope of the present invention.

The conventional heat sink structure is manufactured by the well-known method of aluminum extrusion and then cut and processed to an appropriate size in order to fit the size of chip sets or processors. The technology of said extruded aluminum heat sinks has the disadvantages of slow production and subsequently high cost. Furthermore, the interspace between heat sink fins can not be too narrow so as to prevent molds from broken by the heavy pressure during extrusion, which indirectly limits the numbers of heat sink fins. The fewer the heat sink fins are, the less the heat dissipating area will be and thereby the slower the dissipating speed will be. Nonetheless, extruded aluminum heat sinks can only made out of molds, which can not be conveniently modified after manufactured. This also poses limitation in the size of the extruded aluminum heat sinks.

Having said disadvantages, conventional extruded aluminum heat sinks have been gradually unable to cope with the increasing speed of the chip sets or processors.

SUMMARY OF THE INVENTION

Specifically, the present invention, a heat sink fin assembly structure, provides a plurality of heat sink fins installed upright and parallel on the base seat of a heat sink, which are manufactured individually and then interlocked as needed. A lateral rim on the bottom portion of a piece-shaped main body of the heat sink fin extends to form a connection piece. A plurality of position holes are drilled on the connection piece; side rims thereof bend upwards to form a number of position pieces and holding pieces. The position pieces on the first heat sink fin insert through the position holes of the second heat sink fin and thereby the position pieces and holding pieces of the first heat sink fin hold and lock both sides of the bottom portion of the shaped-piece main body of the second heat sink fin. Therefore, the first and second heat sink fins are interlocked with each other.

Having said interlocking and connecting structure between heat sink fins prevents heat sinks from molding and extrusion thereby accelerating the production speed. Furthermore, heat sink fins can be massively produced by pouching technology thereby achieving the effectiveness of low cost, which is the first advantage of the present invention.

Since a plurality of heat sink fins are assembled by interlocking and connecting, the quantity of heat sink fins can be adjusted if needed. This is the second advantage of the present invention.

Furthermore, the connection piece extended from the lateral rim on the bottom portion of every heat sink fin is for another heat sink fin to assemble. Therefore, the narrower the width of the connection piece is, the smaller the interspace between two adjacent heat sink fins will be, so the quantity of heat sink fins available on the heat sink will increase and the heat dissipating area will increase relatively and the heat dissipating process will be more efficient. This is the third advantage of the present invention.

To enable a further understanding of the structure and functions of the invention herein, the brief description of the drawings below are followed by detailed description of the most preferred embodiment of the present invention.

DETAILED DESCRIPTION OF THE PREFERRED EMBODIMENTS

Figure 1:
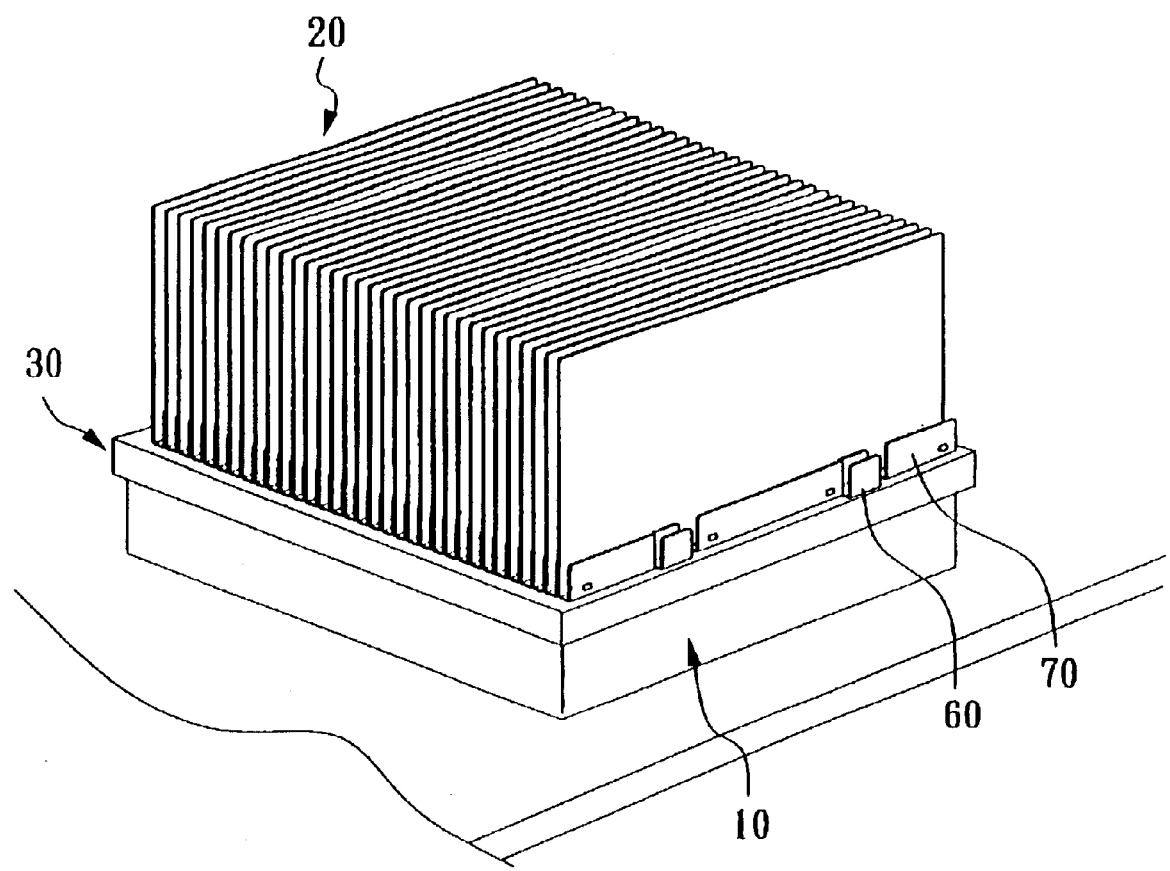
FIG. 1 is a perspective drawing of the preferred embodiment of the present invention applied on a heat sink base above a processor.

Referring to FIG. 1, the present invention, a heat sink fin assembly structure, is particularly suitable for various computer chip sets or processors (10). The structure is assembled by interlocking and connecting a plurality of upright and parallel heat sink fins (20) installed on a base seat (30) of a heat sink.

Figure 2:
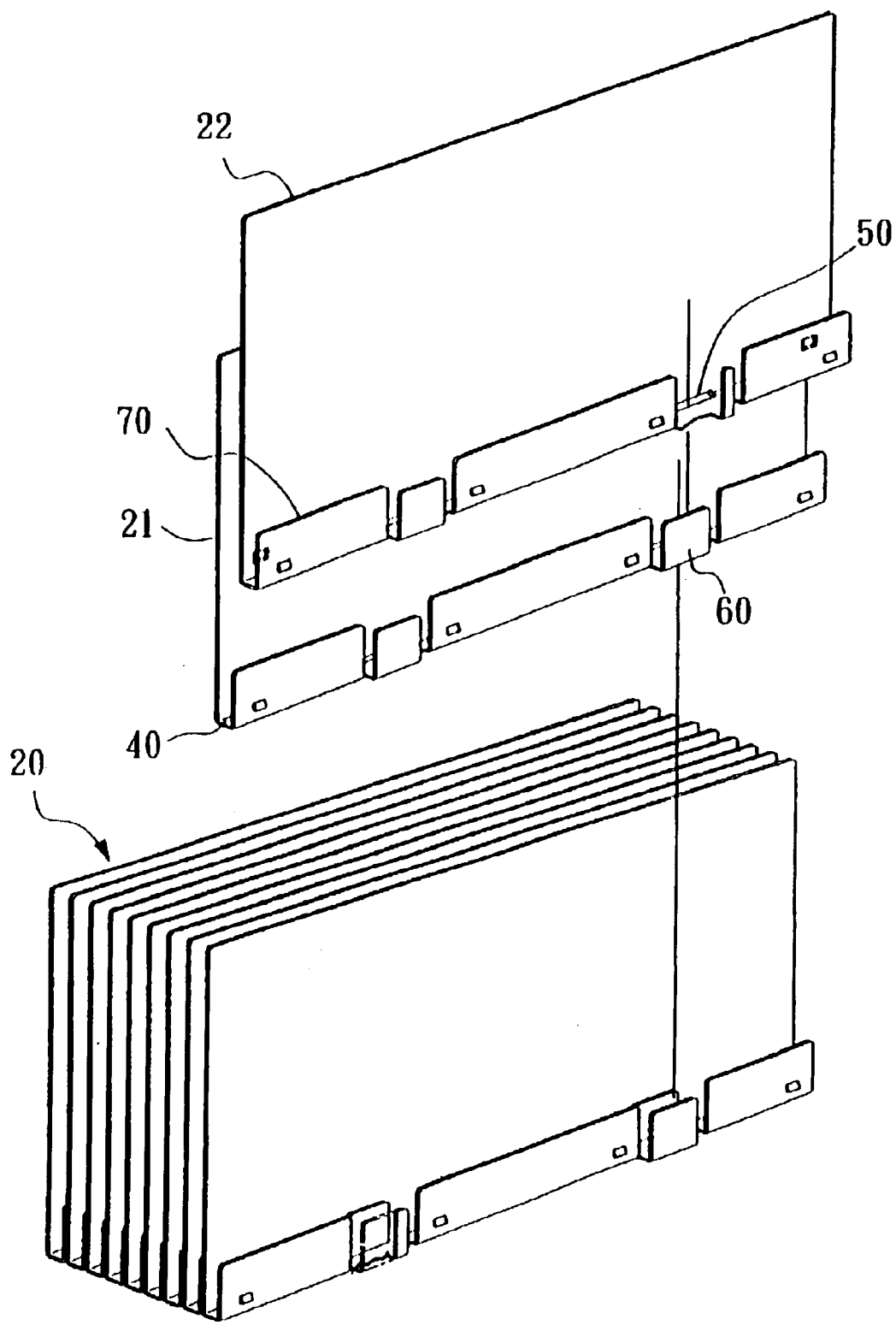
FIG. 2 is a perspective exploded drawing of the preferred embodiment of the present invention.

Referring to FIG. 2, each heat sink fin (20) forming said plurality of heat sink fins (20) has a connection piece (40) extended horizontally from a lateral rim on the bottom portion of the piece-shaped main body thereof. On said connection piece drilled a number of position holes (50) and side rims thereof bend upwards to form a plurality of position pieces (60) and holding pieces (70). The position pieces (60) and holding pieces (70) of a first heat sink fin (21) hold and fix the second heat sink fin (22) on both sides of the bottom portion of the piece-shaped main body thereof, which interlocks the first (21) and second heat sink fins (22), and forms an interspaces between the two heat sink fins. In this order, the heat sink fins (21, 22 . . . ) are assembled and connected, and then are fixed on a heat sink base seat (30), as mentioned in FIG. 1, to form a complete heat sink.

Figure 3:
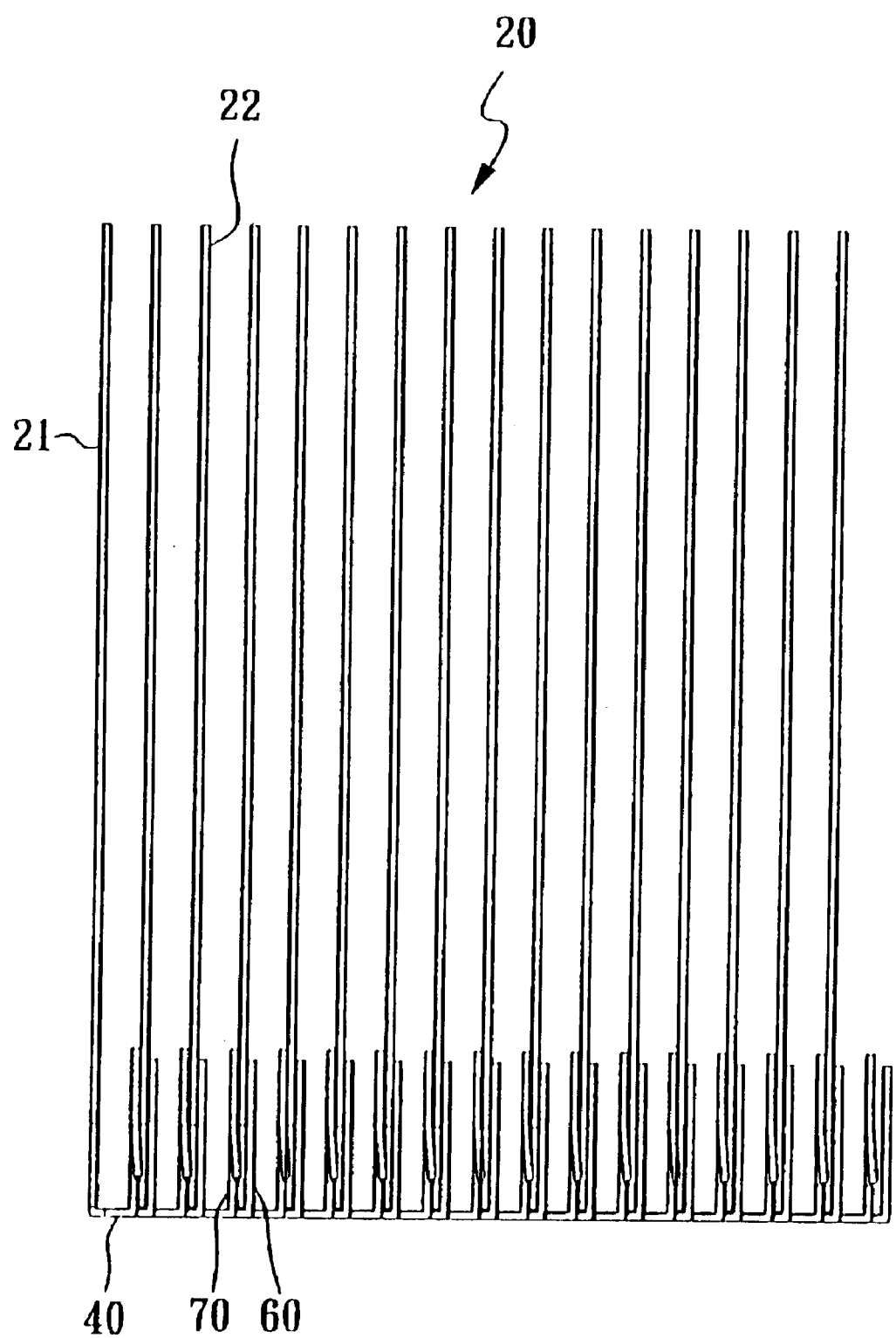
FIG. 3 is a side plan view of the preferred embodiment of the present invention
Figure 4:
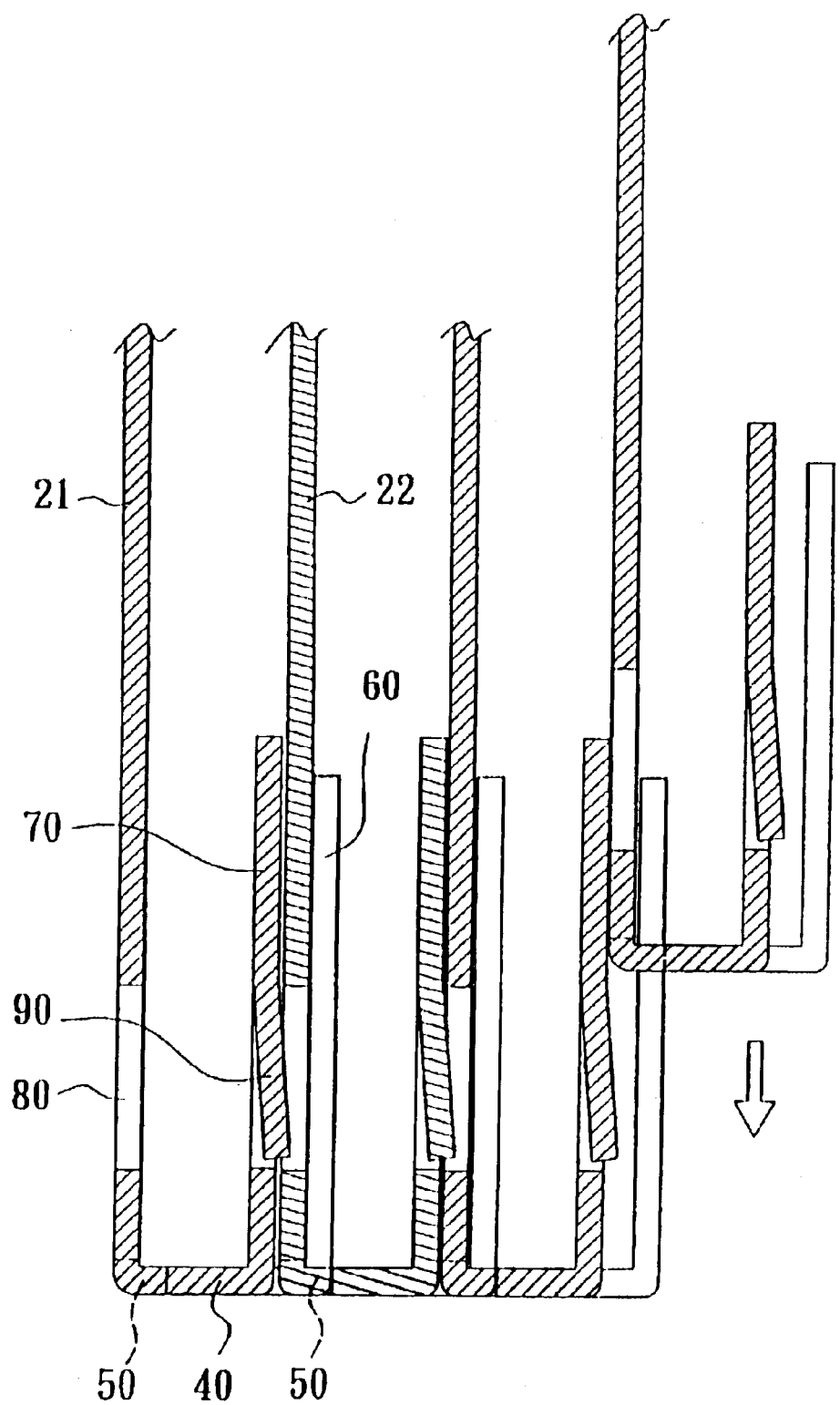
FIG. 4 is a partially cross-sectional and schematic view of the preferred embodiment of the present invention

Referring FIG. 3 and FIG. 4, the position pieces (60) and holding pieces (70) of the said first heat sink fin (21) retain the second heat sink fin (22) on both sides of the bottom portion of the piece-shaped main body thereof. Therefore, an interspace about equal to the thickness of the piece-shaped main body of a heat sink fin (20) is created between the position pieces (60) and holding pieces (70). The position holes (50) locate on the side of the bottom portion of the piece-shaped main body of each heat sink fin (20). While assembling, the position pieces (60) of the first heat sink fin (21) inserts through the position holes (50) of the second heat sink fin (22) from below, thereby the bottom portion of the piece-shaped main body of the second heat sink fin (22) is retained by the position pieces (60) and holding pieces (70) of the first heat sink fin (21). In other words, to assemble the first (21) and second (22) heat sink fins, one needs only to focus the position holes (50) of the second heat sink fin (22) to the position pieces, (60) of the first heat sink fin (21) and press the second heat sink fin (22) from above. The same method applies to assemble the third heat sink fin, the fourth heat sink fin . . . , etc, and therefore completes the assembling of all the heat sink fins on a heat sink.

The connection piece (40) on the lateral rim of the bottom portion of the piece-shaped main body of each said heat sink fin (20), the position holes (50) on the said connection piece, the position pieces (60) and holding pieces (70) can be manufactured by pouching technology from a single piece, which, compared to the conventional extrusion technology, is more cost-effective. More importantly, each heat sink fin (20) is individually manufactured, and therefore the structure can be assembled according to the quantity needed. The larger the quantity of heat sink fins is, the larger the heat sink assembled will be. So the size of a heat sink can be modified in accordance with various chip sets and processors.

Moreover, as seen in FIG. 1, since a lateral rim on the bottom portion of every heat sink fin extends horizontally to form a connection piece (40) which is to assembled with another heat sink fin (20). Therefore, the narrower the width of the connection piece (40) is, the smaller the interspace between two adjacent heat sink fins (20) will be, so that more heat sink fins (20) can be installed on the heat sink base seat (30) of the same size, and thereby the heat dissipating area increases relatively and the heat dissipating process is more efficient.

In addition, as seen from FIG. 1–4, in order to enhance the fixation between heat sink fins (20) while assembling, a number of recess holes (80) can be installed on the lower portion of the piece-shaped main body of each heat sink fin (20); clasps (90) are disposed on corresponding locations on the holding pieces (70). When the second heat sink fin (22) is pressed from above to be assembled with the first heat sink fin (21) to the fixed position, the clasps (90) of the first heat sink fin (21) can be fastened in the recess holes (80) of the second heat sink fin (22) thereby completing positioning and enhancing the fixation between two heat sink fins (20).

The present invention has been described with preferred embodiments thereof and it is understood that many changes and modifications in the described embodiments can be carried out without departing from the scope and the spirit of the invention that is intended to be limited only by the appended claims.

What is claimed is:

1. A heat sink fin assembly structure comprises a plurality of heat sink fins assembled to form a plurality of upright and parallel heat sink fins on a base seat of the heat sink, which is characterized that a lateral rim on a bottom portion of a piece-shaped main body of the heat sink fin extends to form a connection piece; a plurality of position holes are drilled on the connection piece; side rims thereof bend upward to form a plurality of position pieces and holding pieces; by inserting the position pieces of the first heat sink fin through the position holes of the second heat sink fin, the position pieces and holding pieces of the first heat sink fin hold and fix on both sides of the bottom portion of the piece-shaped main body of the second heat sink fin thereby interlocking the first and second heat sink fins.

2. A structure for a heat sink fin assembly of claim 1, wherein an interspace between positioning pieces and holding pieces is about equal to the thickness of the piece-shaped main body of a heat sink fin; the position holes locate on the lateral side of said piece-shaped main body of a heat sink fin.

3. A structure for a heat sink fin assembly of claim 1, wherein a plurality of recess holes are disposed at the lower portion of the piece-shaped main body of every heat sink fin and clasps are disposed on the corresponding location on the holding pieces; when the second heat sink fin is pressed from above to the position that interlocks with the first heat sink fin, the clasps of the first heat sink fins is fastened in the recess holes of the second heat sink fin.

* * * * *